United States Patent
El-Kik

(10) Patent No.: US 6,278,307 B1
(45) Date of Patent: Aug. 21, 2001

(54) METHOD AND APPARATUS FOR 50% DUTY-CYCLE PROGRAMMABLE DIVIDED-DOWN CLOCK WITH EVEN AND ODD DIVISOR RATES

(75) Inventor: Tony S. El-Kik, Allentown, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/624,618

(22) Filed: Jul. 24, 2000

(51) Int. Cl.[7] .................................................. H03K 3/017
(52) U.S. Cl. ............................................. 327/175; 327/160
(58) Field of Search ..................................... 327/160, 172, 327/177, 115, 116, 151, 291, 294, 299, 99; 377/47, 48

(56) References Cited

U.S. PATENT DOCUMENTS

| | | | |
|---|---|---|---|
| 5,524,035 | * 6/1996 | Casal et al. | 377/47 |
| 6,133,796 | * 10/2000 | Monk | 331/16 |
| 6,154,076 | * 11/2000 | Hastings | 327/175 |
| 6,198,317 | * 3/2001 | Chow et al. | 327/116 |

* cited by examiner

Primary Examiner—My-Trang Nu Ton
(74) Attorney, Agent, or Firm—Schnader Harrison Segal & Lewis LLP

(57) ABSTRACT

A 50% duty-cycle divided-down clock with selectable divisor rates. A simple architecture comprised of two n-bit counters, a state machine, 2 toggle flip-flops, and two 2-to-1 muxes is used to allow an input clock signal to be divided down by any divisor rate up to $2^n$.

3 Claims, 4 Drawing Sheets

FIG. 2

| countp | countn | sm_count | sm-out | en2 |
|---|---|---|---|---|
| 000 | 000 | 0000 | 0 | 1 |
| 000 | 001 | 0001 | 1 | 1 |
| 001 | 001 | 0010 | 0 | 1 |
| 001 | 010 | 0011 | 1 | 1 |
| 010 | 010 | 0100 | 0 | 1 |
| 010 | 011 | 0101 | 1 | 1 |
| 011 | 011 | 0110 | 0 | 1 |
| 011 | 000 | 0111 | 1 | 1 |

FIG. 3

| GENERALIZED STATE MACHINE TABLE FOR ODD INPUT DIVISORS m | | | | |
|---|---|---|---|---|
| countp | countn | sm_count | sm-out | en2 |
| 0 | 0 | 0 | 0 | 1 |
| 0 | 1 | 1 | 1 | 1 |
| 1 | 1 | 2 | 0 | 1 |
| 1 | 2 | 3 | 1 | 1 |
| 2 | 2 | ... | ... | ... |
| 2 | 3 | ... | ... | ... |
| ... | 3 | ... | ... | ... |
| ... | ... | ... | ... | ... |
| ... | ... | ... | ... | ... |
| ... | $(m-1)/2-1$ | ... | ... | ... |
| $(m-1)/2-1$ | $(m-1)/2-1$ | ... | ... | ... |
| $(m-1)/2-1$ | $(m-1)/2$ | $m-2$ | 1 | 1 |
| $(m-1)/2$ | $(m-1)/2$ | $m-1$ | 0 | 1 |
| $(m-1)/2$ | 0 | $m$ | 1 | 1 |

METHOD AND APPARATUS FOR 50% DUTY-CYCLE PROGRAMMABLE DIVIDED-DOWN CLOCK WITH EVEN AND ODD DIVISOR RATES

BACKGROUND OF THE INVENTION

1. Field of the Invention

The present invention relates to an improved 50% duty-cycle divided clock which can produce, from an input clock signal, an output clock signal divided down from the input clock signal, where the divisor rate may be an odd or an even number.

2. Background of the Invention

In many contexts, a circuit may require two related 50% duty cycle clock signals—one 50% duty cycle signal, and a second 50% duty cycle clock signal which is a divided-down clock signal based on the first clock signal. This divided-down signal is difficult to achieve if the divisor rate is not a power of two; odd divisor rates are harder to achieve.

A divide-down clock with a choice of divisor rates is useful in many contexts. At times, different circuits or components in a piece of electronics will require clock signals which are related by different divisor speeds.

Prior art circuits must operate on both edges of the main clock to provide higher speed throughput. A circuit which could provide improved speed would be desirable.

OBJECTS OF THE INVENTION

Accordingly, it is an object of the present invention to provide a circuit which can produce a divided-down clock signal for any divisor rate presented, and thereby improve the speed of the device.

SUMMARY OF THE INVENTION

A divided clock outputting a 50% duty rate clock signal equal to an input clock signal divided by a divisor rate n bits wide.

BRIEF DESCRIPTION OF THE DRAWINGS

The above objects, and other features and advantages of the present invention will become more apparent after reading the following detailed description, and by reference to the drawings, in which:

FIG. 2 illustrates the inputs and outputs of the state machine employed in one embodiment of the present invention where the input divisor rate PI is 7; and FIG. 3 illustrates the inputs and outputs of the state machine for the general case where input divisor rate PI is m.

DETAILED DESCRIPTION OF PREFERRED EMBODIMENT

The circuit according to the present invention may be described in detail by referring to the attached drawings.

The present invention provides a circuit which takes as inputs a clock signal and a divisor rate, and produces as an output a clock signal with a 50% duty cycle which is based on the input clock signal, divided down by the divisor rate.

Figure 1:
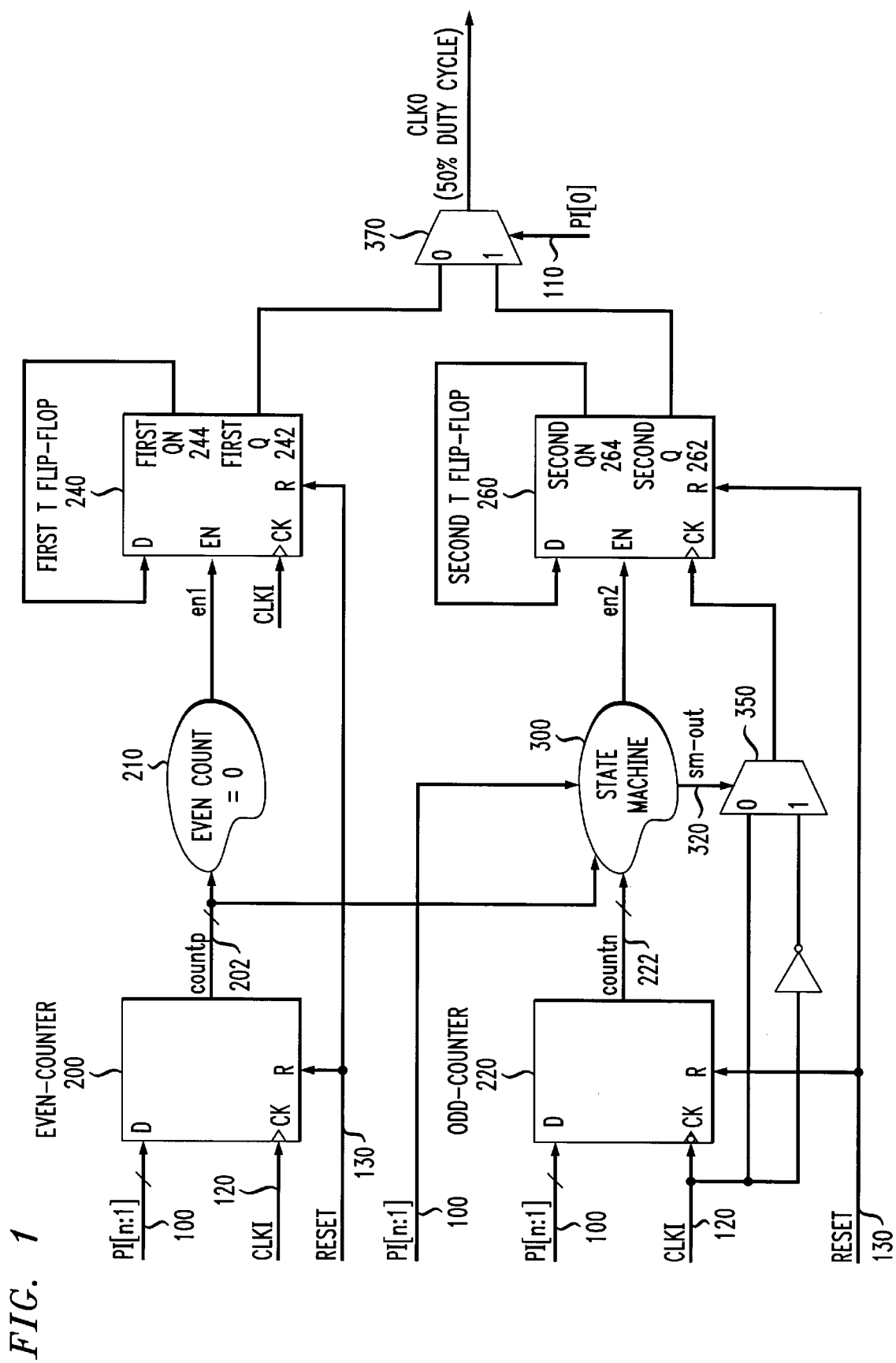
FIG. 1 illustrates a schematic view of the circuit according to one embodiment of the present invention.

As shown in FIG. 1, a preferred embodiment of the present invention has as one input parallel load input PI[n:0] (shown as PI[n:1] 100 and PI[0] 110). The highest n-1 bits of PI[n:0] (that is, PI[n: 1] 100) are loaded into Even-Counter 200, which is an n-bit counter, clocked on the positive edge of input clock signal CLKI 120. PI[n:1] 100 is also loaded into Odd-Counter 220, which is also an n-bit counter, but which is clocked on the negative edge of CLKI 120.

When countp 202 (the output of Even-Counter 200) reaches a count of zero, circuitry 210 sends a signal which enables First T Flip-Flop 240. First Q 242, the Q output of First T Flip-Flop 240, is the even count output. As shown, First T Flip-Flop 240 is clocked on CLKI 120. First QN 244, the QN output of First T Flip-Flop 240, is tied to input D.

The output of Odd-Counter 220, countn 222 is used as an input to a state machine 300. FIG. 2 describes the inputs (countp 202 and countn 222), outputs (en2 310 and sm-out 320) and internal counter (sm_count 330) which make up the state table for state machine 300, for the implementation where the divisor rate input PI is 4 bits wide (i.e., n=4) and where PI[n:1] 100 is 011. For any combination of countp 202, countn 222, and sm_count 330 which is not listed in FIG. 2, en2 310 is 0 and sm_count is unchanged. The table shown in FIG. 2 contains the state table for a divisor rate input size of four bits and a divisor rate whose most significant bits are 011. In a preferred embodiment, state machine 300 contains a state table or can generate a state table for all possible odd values of PI[n:1] 100. Such a generalized state table is shown in FIG. 3. As in FIG. 2, for any combination of countp 202, countn 222, and sm_count 330 which is not listed en2 310 is 0 and sm_count is unchanged.

Sm-out 320 provides an input to 2-to-1 second T flip-flop clock mux 350, which will make Second T Flip-Flop 260 toggle on the rising edge of CLKI 120 if sm-out 320 is 0. If sm-out 320 is 1, then Second T Flip-Flop 260 will toggle on the rising edge of $\overline{\text{CLKI}}$, that is, on the falling edge of CLKI 120. Second Q 262, the Q output of Second T Flip-Flop 260, is the odd-count output. Second QN 264, the QN output of Second T Flip-Flop 260, is tied to the D input of Second T Flip-Flop 260. The least significant bit of PI[n:0] (PI[0] 110) is used to allow odd/even 2-to-1 mux 370 to select between the First Q 242 and Second Q 262. If PI[0] is zero, First Q 242 (even-count output) is output as CLK0 400; if PI[0] 130 is one, Second Q 262 (odd-count output) is the output.

A reset signal 130 is also provided to Even-Counter 200, Odd-Counter 220, First T Flip-Flop 240, and Second T Flip-Flop 260.

Figure 4:
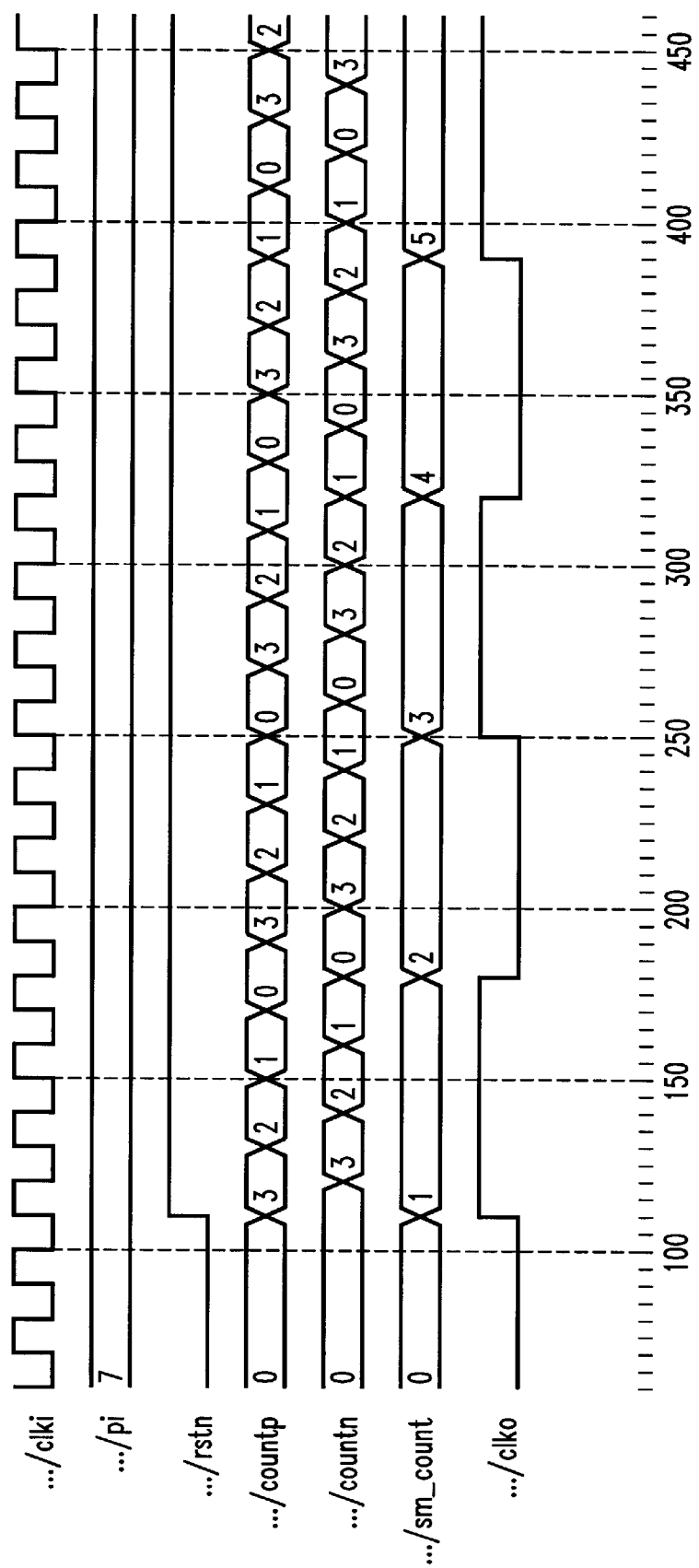
FIG. 4 illustrates the inputs and outputs of the circuit according to one embodiment of the present invention, where the input divisor rate PI is 7.

FIG. 4 shows the value of the various signals over time where PI=7 and n=4. As shown in FIG. 4, the output clock signal CLK0 400 changes from 0 to 1 or from 1 to 0 once for every seven changes in input clock signal CLK1 120. The state machine must be able to generate this table or have it stored in memory for each m in order for the circuit to be able to use m as PI.

Figure 5:
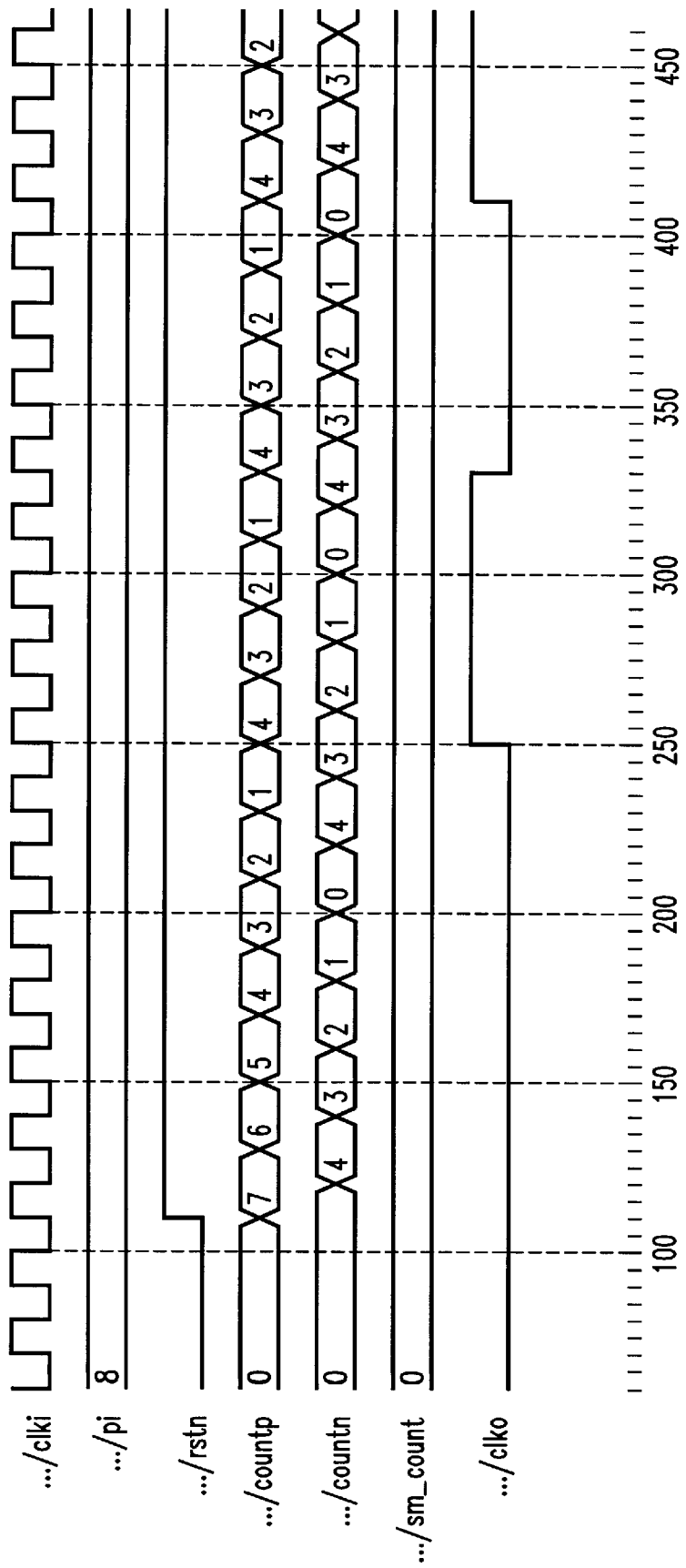
FIG. 5 illustrates the inputs and outputs of the circuit according to one embodiment of the present invention, where the input divisor rate PI is 8.

FIG. 5 shows the value of the various signals over time where PI=8 and n=4. As shown in FIG. 5, the output clock signal CLK0 400 changes from 0 to 1 or from 1 to 0 once for every eight changes in input clock signal CLK1 120.

While the present invention has been particularly shown and described with reference to the particular embodiments thereof, it will be understood by those skilled in the art that various changes in form and details may be effected therein without departing from the spirit and scope of the invention as defined by the appended claims.

I claim:

1. A divided clock outputting on output clock signal equal to an input clock signal divided by an input divisor rate, comprising:

even counter circuitry, with clock input of said input clock signal, and counter input of the high n-1 bits of said input divisor rate;

zero circuitry which sets its output high when its input is zero, with input of the output from said even counter circuitry, operably connected to said even counter circuitry;

first T flip-flop circuitry, with clock input of said input clock signal, enable input of output of said zero circuitry, and D input of the QN output of said first T flip-flop circuitry, operably connected to said zero circuitry;

odd counter circuitry, with clock input of the negation of said input clock signal, counter input of the high n-1 bits of said input divisor rate;

clock mux circuitry, with inputs of said input clock signal and the inverse of said input clock signal and toggle input of a first output of state machine circuitry, operably connected to said state machine circuitry;

said state machine circuitry with an internal state machine counter value, which sets its outputs and said internal state machine counter according to state machine table and the values of aid internal state machine counter and an input, with a first input from the output of said even counter circuitry, second input from said output form said odd counter circuitry, first output to said clock mux circuitry, second output to second T flip-flop circuitry, operably connected to said odd counter circuitry, said even counter circuitry, said clock mux circuitry and said second T flip-flop circuitry; and said second T flip-flop circuitry, with clock input of the output of said clock mux circuitry, enable input of said second output of said state machine circuitry, and D input of the QN output of said second T flip-flop circuitry, operably connected to said state machine and said clock mux.

2. The divided clock of claim 1 where said state machine table corresponds to the following table, where said divisor rate is m:

| said first input from said output of said even counter | said second input from said output of said odd counter | said internal state machine counter | said first output to said clock mux | said second output to said second T flip-flop |
|---|---|---|---|---|
| 0 | 0 | 0 | 0 | 1 |
| 0 | 1 | 1 | 1 | 1 |
| 1 | 1 | 2 | 0 | 1 |
| 1 | 2 | 3 | 1 | 1 |
| 2 | 2 | ... | ... | ... |
| 2 | 3 | ... | ... | ... |
| ... | 3 | ... | ... | ... |
| ... | ... | ... | ... | ... |
| ... | ... | ... | ... | ... |
| ... | (m − 1)/2 − 1 | ... | ... | ... |
| (m − 1)/2 − 1 | (m − 1)/2 − 1 | ... | ... | ... |
| (m − 1)/2 − 1 | (m − 1)/2 | m − 2 | 1 | 1 |
| (m − 1)/2 | (m − 1)/2 | m − 1 | 0 | 1 |
| (m − 1)/2 | 0 | m | 1 | 1. |

3. A divided clock outputting an output clock signal equal to an input clock signal divided by an input divisor rate comprising:

first counter circuitry and first flip-flop circuitry, operably connected to each other and to said input clock signal and said first counter circuitry operably connected to said input divisor rate and said first flip-flop circuitry outputting a first output clock signal divided down by said input divisor rate when said input divisor rate is even;

second counter circuitry operably connected to said input clock signal and said divisor rate, state machine circuitry operably connected to said second counter circuitry and said divisor rate, and second flip flop circuitry, operably connected to said state machine and to said input clock signal and outputting a second output clock signal divided down by said input divisor rate when said input divisor rate is odd;

and mux circuitry, operably connected to said first output clock signal and said second output clock signal and the lowest bit of said input divisor rate, and outputting said first output clock signal if said lowest bit of said input divisor rate is 0, and sad second output clock signal if said lowest bit of said input divisor rate is 1.

* * * * *